(12) United States Patent
Fuchs et al.

(10) Patent No.: US 8,519,253 B2
(45) Date of Patent: Aug. 27, 2013

(54) METHOD FOR CONVERTING THERMAL ENERGY INTO ELECTRICAL ENERGY

(76) Inventors: Herbert Karl Fuchs, Gmunden (AT); Reinhold Koebrunner, Voecklabruck (AT)

( * ) Notice: Subject to any disclaimer, the term of this patent is extended or adjusted under 35 U.S.C. 154(b) by 98 days.

(21) Appl. No.: 12/998,654

(22) PCT Filed: Nov. 11, 2009

(86) PCT No.: PCT/AT2009/000428
§ 371 (c)(1),
(2), (4) Date: Jun. 6, 2011

(87) PCT Pub. No.: WO2010/063044
PCT Pub. Date: Jun. 10, 2010

(65) Prior Publication Data
US 2011/0277801 A1 Nov. 17, 2011

(30) Foreign Application Priority Data
Nov. 14, 2008 (AT) .................. A 1774/2008

(51) Int. Cl.
*H01L 35/32* (2006.01)
(52) U.S. Cl.
USPC .............. 136/201; 136/203; 136/205; 62/3.2; 62/3.3
(58) Field of Classification Search
USPC ........................ 136/201, 203, 205; 62/3.2, 3.3
See application file for complete search history.

(56) References Cited

U.S. PATENT DOCUMENTS

| | | | |
|---|---|---|---|
| 3,392,061 A | 7/1968 | Schreiner et al. | |
| 3,607,444 A * | 9/1971 | DeBucs | 136/208 |
| 3,870,568 A * | 3/1975 | Oesterhelt et al. | 136/212 |
| 5,712,448 A | 1/1998 | Vandersande et al. | |
| 2002/0033189 A1 | 3/2002 | Macris | |
| 2004/0018729 A1 | 1/2004 | Ghoshal et al. | |
| 2006/0107986 A1 | 5/2006 | Abramov et al. | |
| 2006/0179849 A1 | 8/2006 | Abramov et al. | |

FOREIGN PATENT DOCUMENTS

| | | |
|---|---|---|
| DE | 1 243 743 | 7/1967 |
| GB | 1 001 584 | 8/1965 |
| JP | 3-155376 | 7/1991 |
| JP | 5-226704 | 9/1993 |
| JP | 5-299704 | 11/1993 |
| JP | 9-214005 | 8/1997 |
| JP | 2002-009350 | 1/2002 |
| WO | WO 94/28364 | 12/1994 |
| WO | WO 2006/085179 | 8/2006 |

OTHER PUBLICATIONS

International Search Report.

* cited by examiner

*Primary Examiner* — Golam Mowla
(74) *Attorney, Agent, or Firm* — Follard & Roe, P.C.

(57) ABSTRACT

The invention relates to a device for converting thermal energy into electrical energy with at least one thermocouple, which thermocouple comprises two thermoelectric branches (A, B) electrically connected in series, and the thermocouple has a first passage surface ($F_1$) and a second passage surface (F) for the heat flow (Q) and for the electrical current (7, 7'). In this connection, the value of the first passage surface ($F_1$) is less than 5% of the value of the second passage surface (F).

9 Claims, 8 Drawing Sheets

Figure 1A:
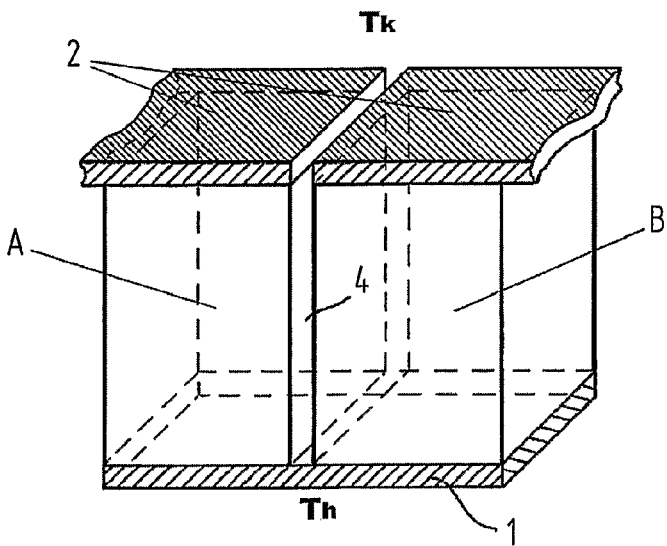

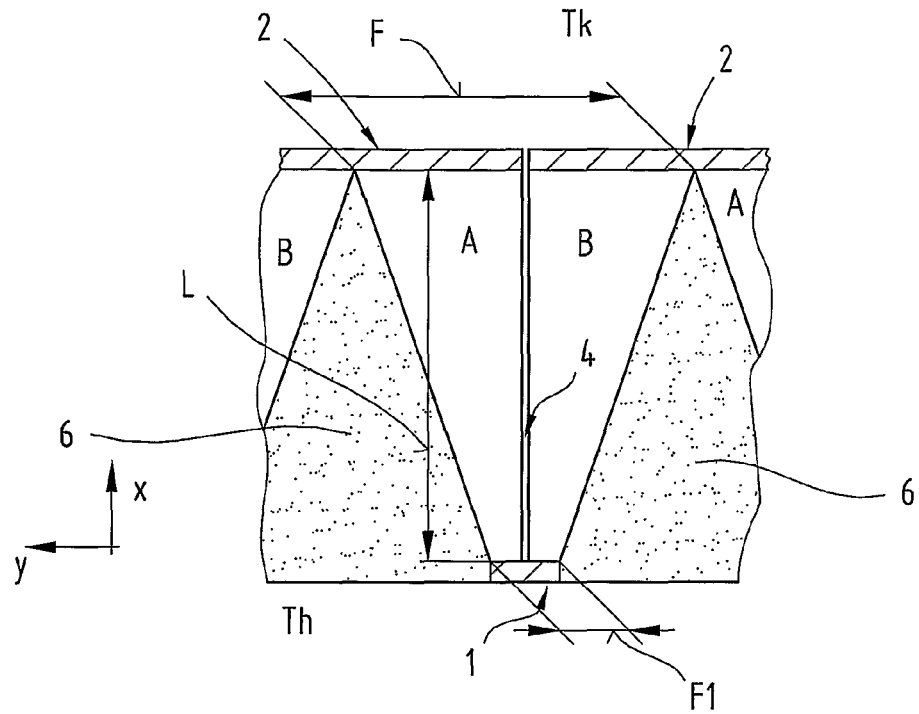
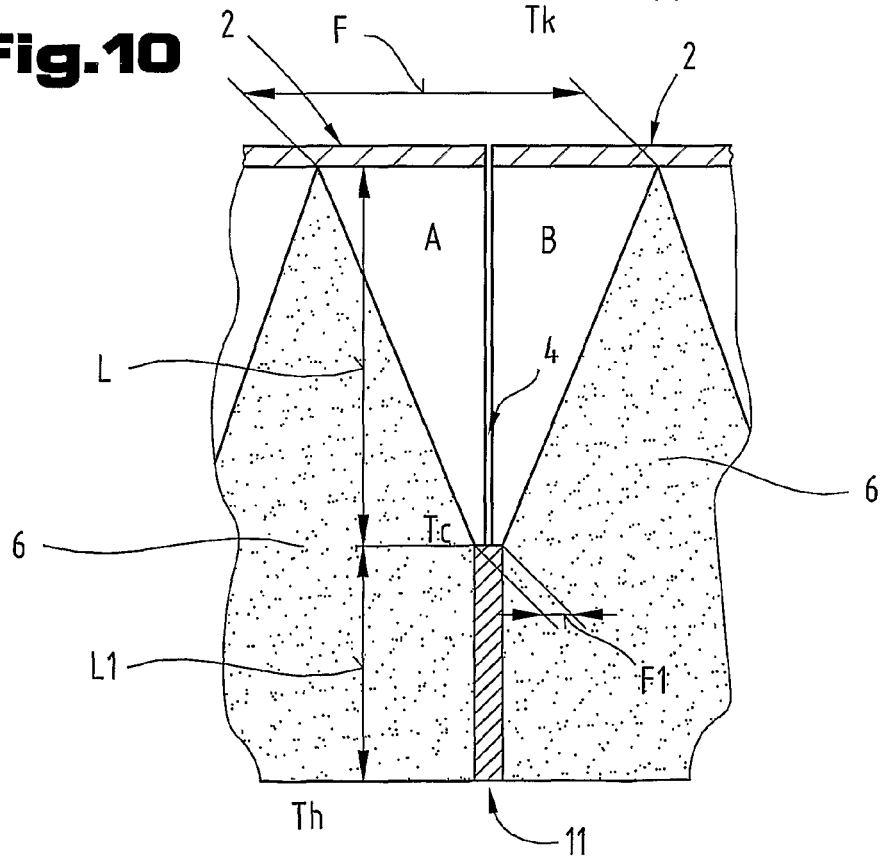

METHOD FOR CONVERTING THERMAL ENERGY INTO ELECTRICAL ENERGY

CROSS REFERENCE TO RELATED APPLICATIONS

This application is the National Stage of PCT/AT2009/000428 filed on Nov. 11, 2009, which claims priority under 35 U.S.C. §119 of Austrian Application No. A 1774/2008 filed on Nov. 14, 2008, the disclosure of which is incorporated by reference. The international application under PCT article 21(2) was not published in English.

The invention relates to a method for converting thermal energy into electrical energy with a thermocouple, of the type outlined in the introductory part of claim 1.

Thermal energy is converted into electrical energy on the basis of this invention using thermoelectric effects, in particular the Seebeck and Peltier effects, and these effects are induced by the existence of a temperature difference (Seebeck effect) or conversely create a temperature difference (Peltier effect).

Conventional methods of generating electrical energy make use of the phenomenon known as the Seebeck effect whereby a potential difference, respectively electrical voltage is generated between two different electrically conducting materials, each of which has different electrical and thermal conducting properties and which are connected to one another in an electrically conducting arrangement by at least one of their ends, when a temperature gradient exists between the mutually connected ends and the oppositely lying ends. The two different materials are therefore connected electrically in series but thermally in parallel. The electrical series connection and thermal parallel connection of a plurality of such thermocouples results in a thermoelectric generator ("TEG"), which is used to produce electrical energy from a temperature difference, which is usually obtained from a heat source on the one hand and a cooling device on the other hand. The degree of efficiency η is calculated in a known manner on the basis of the quotient of electrical power P and the total heat flow Q.

$$\eta = \frac{P}{Q} \text{ or } \eta = \frac{\text{electrical power obtained}}{\text{thermal energy input/unit of time}}$$

The disadvantage of all the currently known TEGs resides in the fact that the degree of efficiency of this form of energy conversion is relatively low (4-6% in the case of semiconductor TEGs). There is therefore an urgent need to significantly improve this currently modest degree of efficiency and develop applications in the field of thermoelectric energy generation that in the past have been reserved for known calorific machines and other forms of generating electrical energy. This would enable the possibilities for environmentally friendly power generation to be broadened without depleting resources whilst making allowance for cost factors.

Thermal energy can easily be generated in a number of ways and is therefore not necessarily based on specific fuels, for example fossil fuels. There are also a number of heat sources available which have been rarely used or totally overlooked in the past. For example, heat given off from industrial processes, heat emitted by internal combustion engines, sources producing heat from the earth, thermal solar energy, etc., are available.

In the past, use of these heat sources has been limited, primarily due to the fact that the temperature level which exists or the difference in temperature compared with the ambient temperature is generally too low, apart from a few rare exceptions, for it to be used by conventional heat generating machines such as steam engines, steam turbines, etc.

A thermoelectric generator is able to use this untapped potential energy at any time and in this respect offers the enormous advantage of being based on a simple design using no moving parts and being virtually maintenance-free. However, the still very low degree of efficiency of 4-6% which can be obtained at the moment has been seen as a massive drawback in terms of cost-benefit.

The objective of the invention is to propose a method of converting thermal energy into electrical energy with a thermocouple to make use of the thermoelectric effect, by means of which a higher degree of efficiency can be obtained.

The objective of the invention is achieved by means of a method based on the characterizing features of claim 1. Accordingly, a method of converting thermal energy into electrical energy with at least one thermocouple to make use of the thermoelectric effect is proposed, whereby the thermocouple comprises two thermoelectric branches electrically connected in series, each with different thermoelectric coefficients, and each of the thermocouples has a contact point to be heated. Compared with the thermoelectric branches, the contact point to be heated has a contact surface that is less than 5% of the value of an "averaged total conducting cross-section" of the two thermoelectric branches.

The advantage of this is that the degree of efficiency for generating thermoelectric energy can be increased significantly because the quantity of heat fed to the thermoelectric generator per unit of time is limited as far as possible to the energy equivalent of the electrical power generated.

In accordance with the invention, it is also proposed that the heat needed by the TEG should be input directly at the temperature level which is available or can be applied via the specially designed contact interfaces of the connecting points of the individual thermocouples constituting the thermoelectric generator of different thermocouple-materials (A, B) which have to be heated. Furthermore, the heat generated in the closed power circuit in parallel due to the Peltier effect, directly and at the same time as the Seebeck effect, is directed to the specially designed hot contact surfaces and only there and is for the most part consumed immediately and converted into in electrical energy.

Consequently, a significantly smaller amount of the heat flowing along the thermoelectric branches constituting the individual thermocouples, which can be regarded as a loss, remains than is the case with currently known systems.

As proposed by the invention, the high degree of efficiency is achieved due to the fact that, unlike all of the conventional systems, the high loss of heat flowing from the heated to the cold contact points is, as far as possible, not prevented by special material properties and instead, only a relatively small surplus amount of unused thermal energy from the energy conversion taking place at the special contact interfaces remains and it can be discharged by heat conduction.

As will be explained in more detail in this specification, in addition to the advantageous conversion process, the remaining heat flow along the branch materials is also limited by additional features. This is achieved due to the fact that the conducting cross-sections of the branch materials constituting the individual thermocouples are disposed relative to one another in an exactly predefined, optimum relationship without the selected or available total dimensions of the thermocouples having to be changed as a result. This cross-sectional optimization results in an additional increase in the degree of efficiency.

The invention represents a further development of known thermoelectric generators operated on the basis of the Seebeck effect, which results in a high degree of efficiency obtained with relatively cheap construction materials that are available in abundance and also enables thermoelectric generators to be used for the purpose of generating energy in sectors where this type of energy generation was prohibitive in the past due to the relatively high costs and relatively low efficiency.

In a specific way, the method proposed by the invention is suitable for using available resources in an environmentally friendly way, including in particular CO2-neutral fuels and as yet untapped heat sources, and is able to run a number of tasks as an autarchic, decentralized energy source.

GENERAL REVIEW OF THE PRIOR ART

Since Seebeck's discovery (1821), there have been no attempts to generate a feasibly high voltage by interconnecting a corresponding number of thermocouples and thus obtain electrical energy from heat in a simple manner and without having to adopt a roundabout approach.

In the second half of the $19^{th}$ century, various types of such devices were already in use, known as "thermoelectric columns" at the time, and were able to replace the standard acid battery elements used until then. In this connection, the thermo-columns of Nobile, Noe, Clamond, Markus, Gülcher, Raub and Cox were known. Raub's thermoelectric columns and that of Cox were already capable of generating enough electrical energy to enable them to be used commercially, in spite of the acknowledged extremely low useful degree of efficiency of at most less than 1% at the time. With the invention of the dynamo by Siemens, which was capable of producing a multiple in terms of voltage and power, thermoelectric columns sank into oblivion at the start of the $20^{th}$ century.

However, the discovery of semiconductors towards the middle of the $20^{th}$ century meant that new thermoelectric materials were available which were able to deliver far higher Seebeck voltages and higher levels of efficiency.

To this day, a series connection of thermocouples made from p and n semiconductor material remains the principle used for thermoelectric generators and Peltier elements.

Since there is no difference between Peltier elements and thermocouples from a technical and physical point of view, a series connection of thermocouples can be used in principle both for generating energy from heat (thermoelectric generator) and for heating or cooling systems.

The effective degree of efficiency of semiconductor thermocouples is significantly higher than that of the original metal thermocouples but could only be improved upon to a modest degree, in spite of intensive research to find new materials towards the end of the $2^{nd}$ millennium. At present, thermoelectric generators made from semiconductor material used in civilian applications still offer a degree of efficiency of only approximately 4%-6%. In the case of military applications and space travel, the figure is currently approximately 7% or slightly more. It is only in the last few years that a new solution for better efficiency has been proposed.

In order to increase the degree of efficiency of thermoelectric energy conversion, there are two basic solutions.

Firstly, the route which was pursued from the outset and is still most widely used to this day is to create materials which deliver higher thermoelectric voltages but nevertheless have usable electrical conductivity without also proportionally increasing thermal conductivity at the same time. The other solution, which has not been pursued so intensively until recent times, is to concentrate not on achieving a high Seebeck coefficient and instead focus on blockading heat conductivity without resulting in a proportional reduction in electrical conductivity at the same time.

The latter of these new solutions is represented by the "Super Lattice Quantum Well" technology which is finding greater favor at the moment. "Quantum Well" technology is currently at a stage where it can deliver a degree of efficiency in the order of approximately 11% and is now in the process of being put to practical testing.

This technology is based on the physical phenomenon whereby extremely thin films of only a few nanometers in thickness made from semiconductor material are only negligibly impaired in terms of their electrical conductivity but are significantly impaired in terms of their thermal conductivity. Thermoelectric materials manufactured using this technology have a structure made up of several tens of thousands of parallel layers separated by isolating intermediate layers per millimeter thickness. The manufacturing process used for this purpose is extremely complex and costly. Another new solution but one which is still at the laboratory stage is to create the effects of "quantum well" technology using semiconductor materials of nanoparticles.

By far the biggest number of publications describes thermoelectric generators in the field of conventional semiconductor technology where the main focus is concentrated on obtaining an advantageous design of the apparatus as a whole or parts of it suited to specific applications but not on improving the degree of efficiency of the energy-generating semiconductor modules. Other publications describe the manufacture of series connections of conventional semiconductor thermocouples using thin-film technology on substrates and optionally miniaturizing them. Finally, other known publications address the composition and manufacture of improved semiconductor materials.

This invention likewise adopts the modern view of increasing the degree of efficiency by limiting as far as possible the losses which occur due to heat conduction along the thermoelectric branches of the heated contact points in the direction towards the contact points which have to be kept cool. Departing from the known prior art, however, the method does not use material technology to reduce the heat conductivity of the thermoelectric materials used.

This invention is based on the fact that the thermoelectric voltage induced by a temperature gradient in conjunction with the relative Seebeck coefficient specific to the material is also obtained at full level even if only a tiny contact point constituting the transition is provided between the two thermoelectric branch materials where the temperature which determines the temperature gradient prevails.

However, thermal losses are unavoidable and are also allowed for in the calculation. The extent of these unavoidable losses represents only a fraction of those which occur in the known systems, however.

Figure 1B:
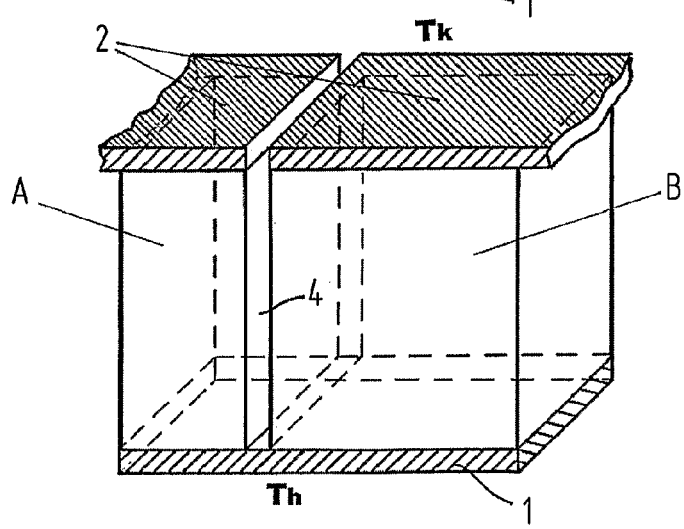
Figure 1C:
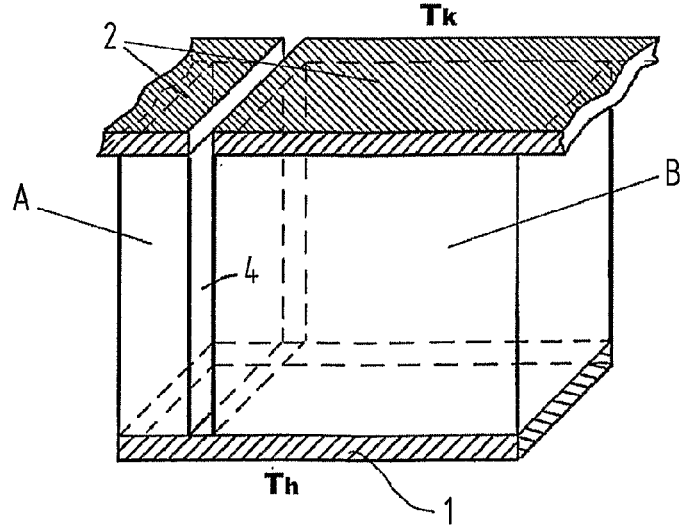
Figure 2A:
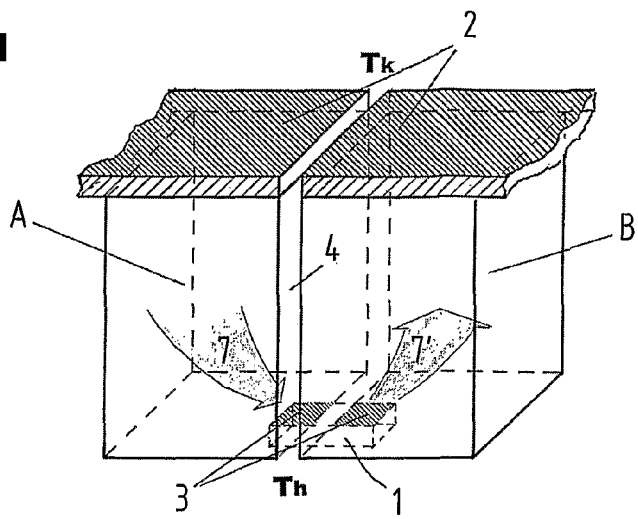
Figure 2B:
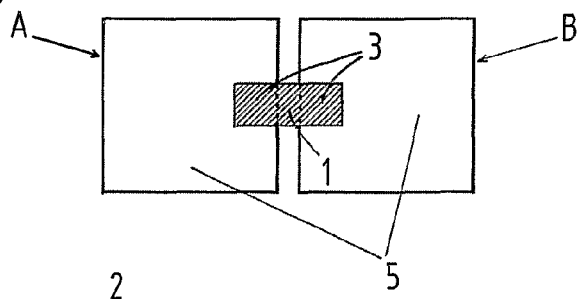
Figure 2C:
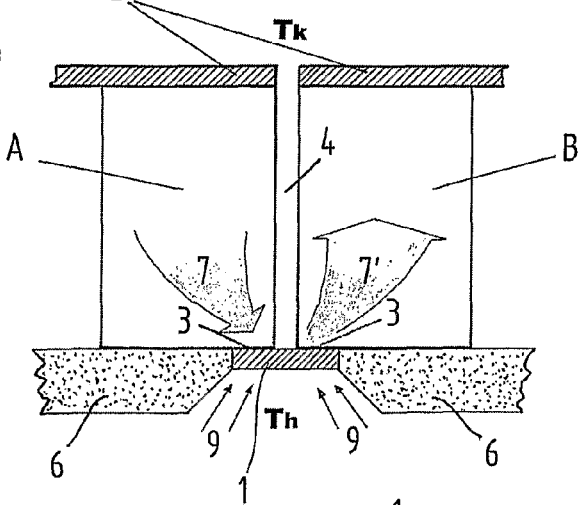
Figure 2D:
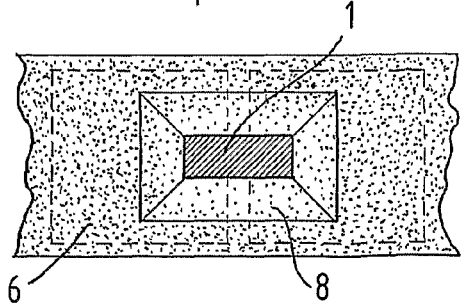
Figure 3A:
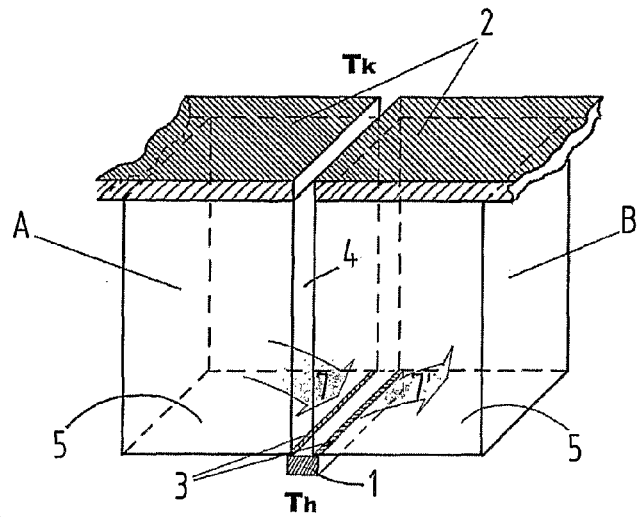
Figure 3B:
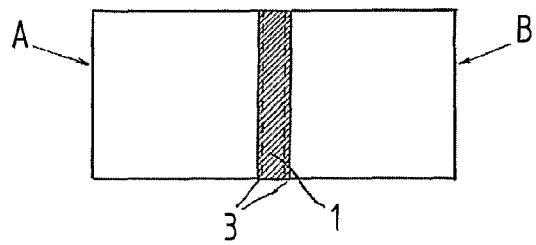
Figure 3C:
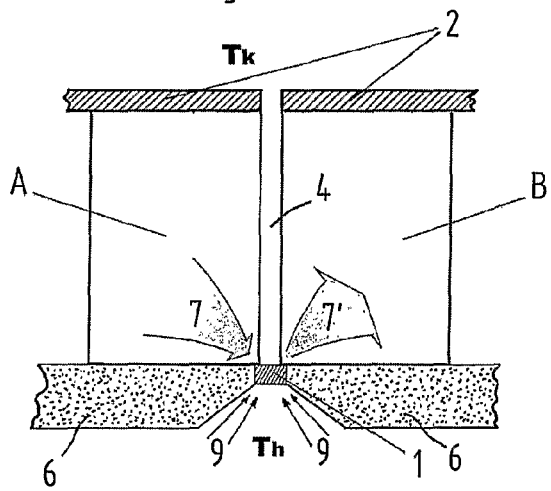
Figure 3D:
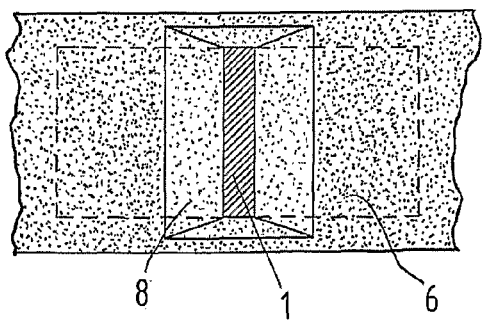
Figure 4:
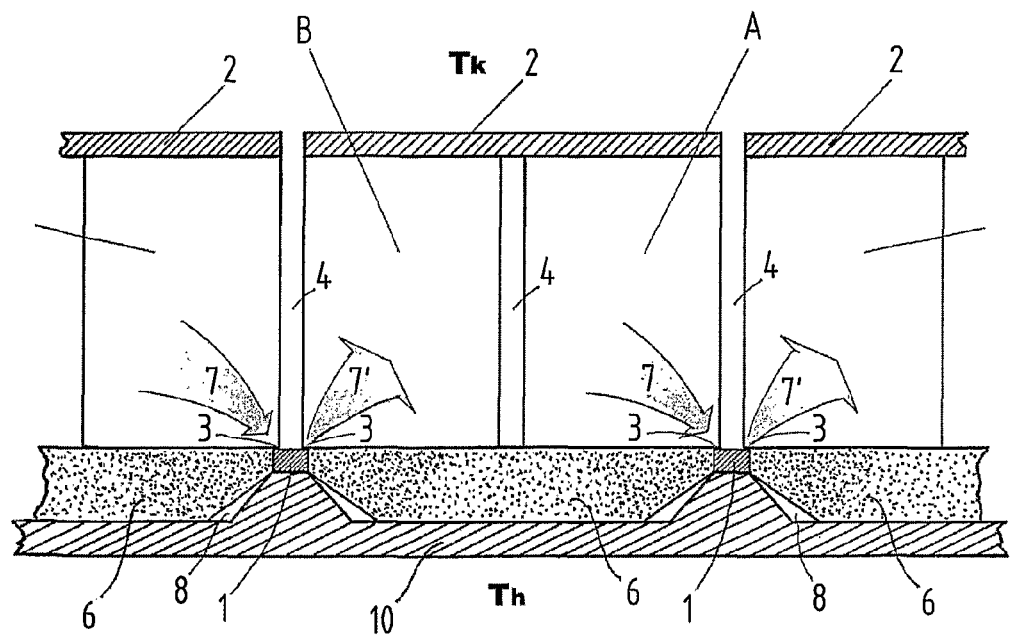
Figure 5:
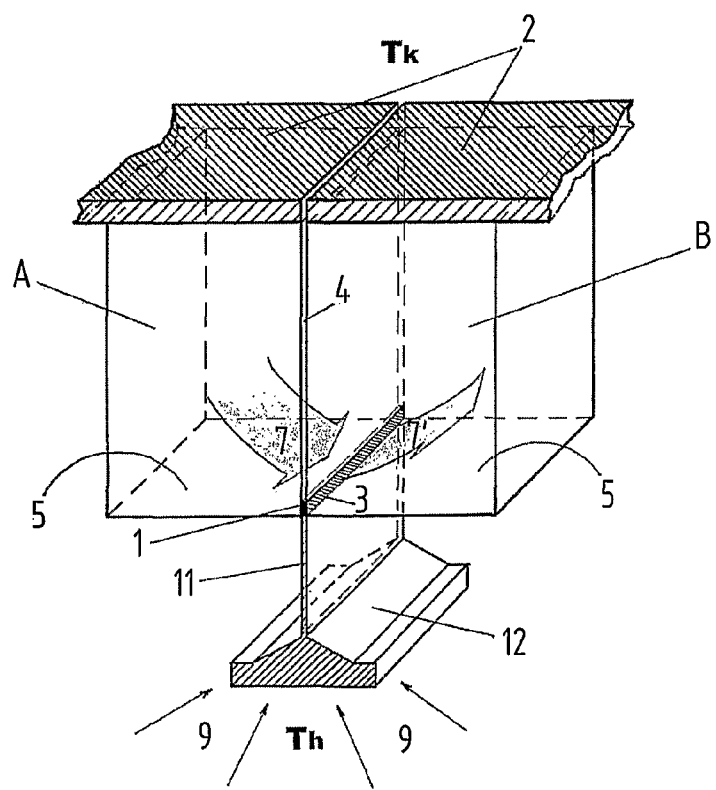
Figure 6A:
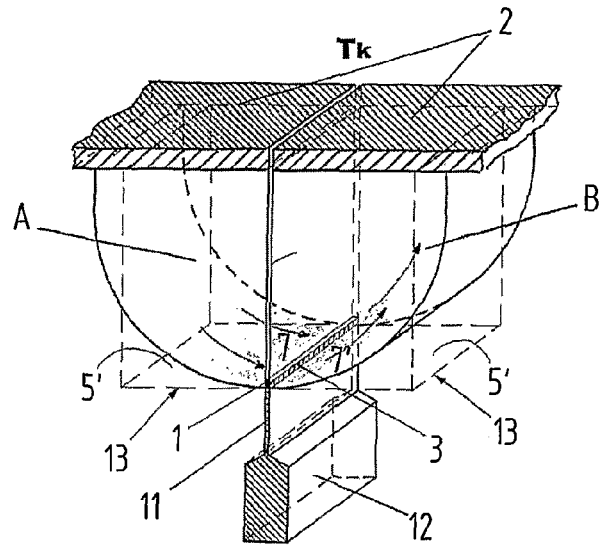
Figure 6B:
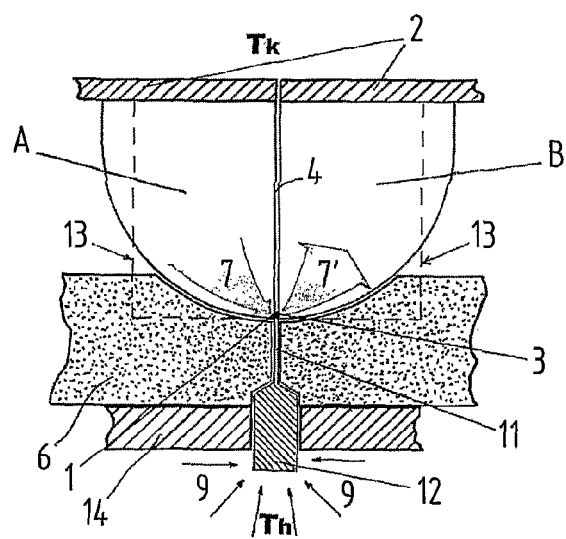
Figure 6C:
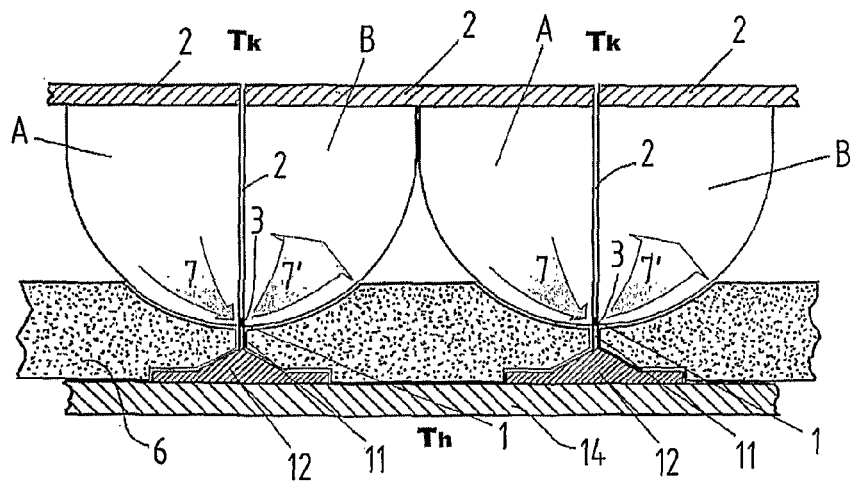
Figure 7:
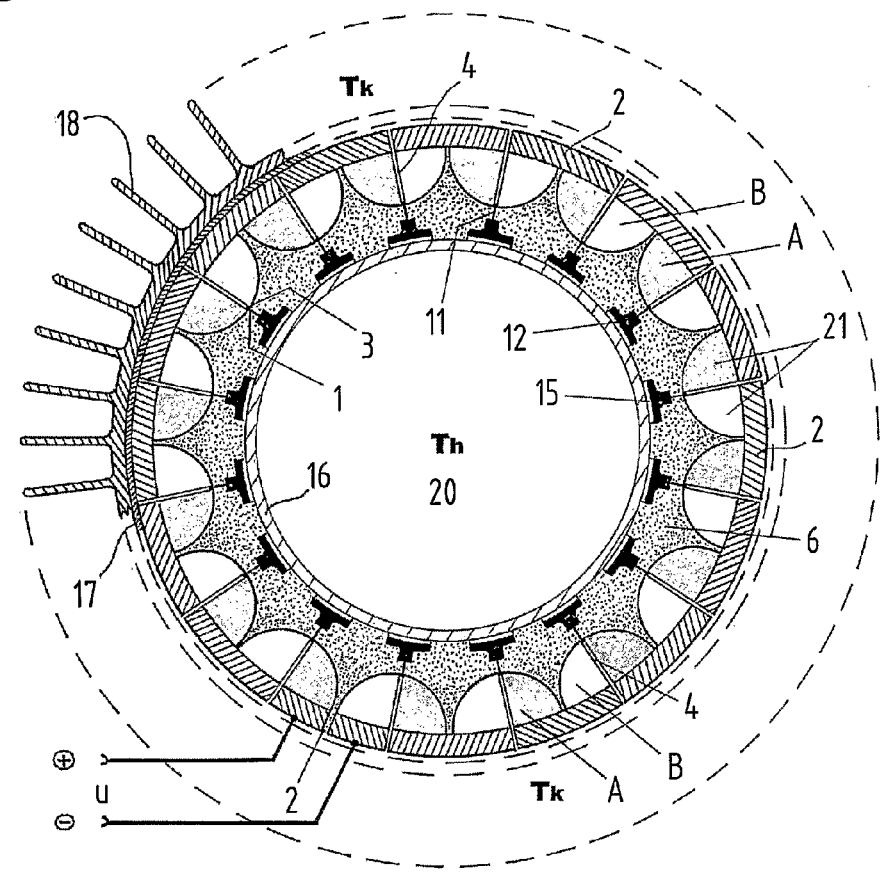
Figure 8:
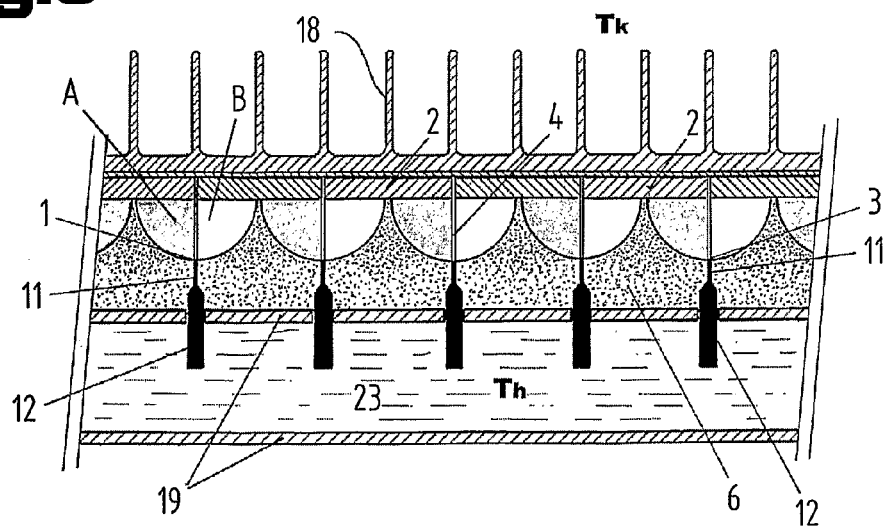
Figure 11:
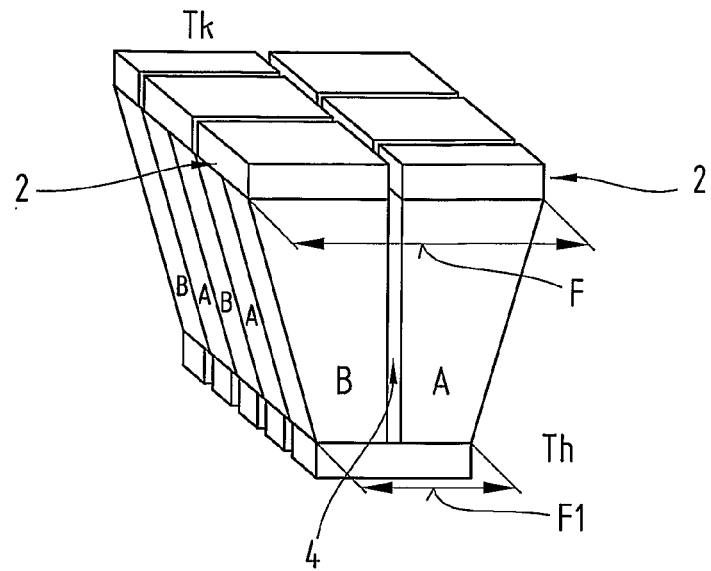
Figure 12:
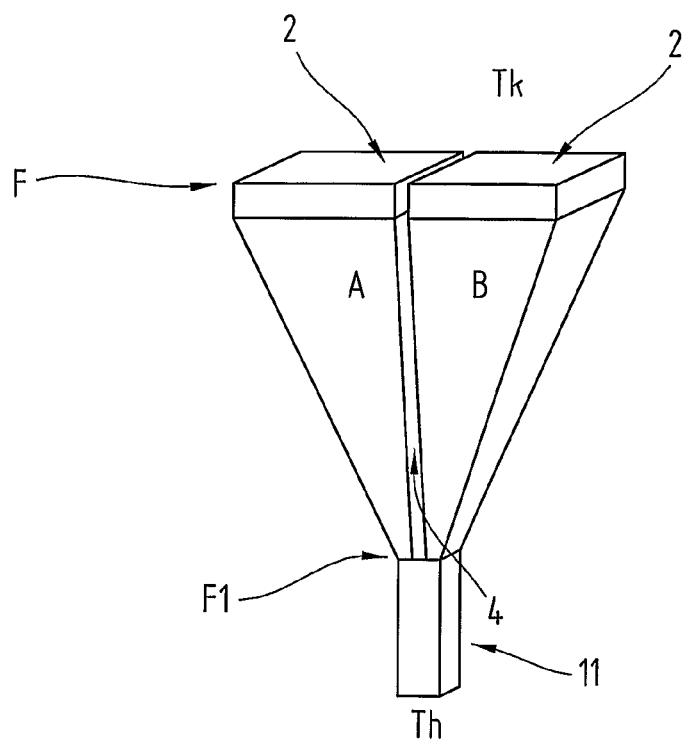

The invention will be explained with reference to the description and appended drawings. These are very schematically simplified diagrams illustrating the following:

FIG. 1a a standard thermocouple without cross-sectional optimization;

FIG. 1b the thermocouple with cross-sectional optimization to obtain the lowest resistance;

FIG. 1c the thermocouple with cross-sectional optimization to obtain the lowest thermal flow;

FIG. 2a the main example of a minimized contact zone based on a "dot" design;

FIG. 2b a view of the minimized contact bridge from underneath;

FIG. 2c the thermocouple in section and the heat input;

FIG. 2d the contact bridge and its heat screen;

FIG. 3a the main example of a "linearly" oriented, minimized contact zone;

FIG. 3b a view of the "linearly" oriented contact bridge from underneath;

FIG. 3c the thermocouple in section and the heat input;

FIG. 3d the contact bridge and its heat screen;

FIG. 4 the heat input on two thermocouples by means of a profiled heat carrier;

FIG. 5 a thermocouple with a "thermo-tongue" and its "thermo-foot" configured on a "linear" contact;

FIG. 6a a preferred embodiment of a thermocouple with rounded branch profiles and a "thermo-tongue" and "thermo-foot";

FIG. 6b the thermocouple in section and the heat input;

FIG. 6c a section showing two thermocouples connected to one another in series based on a preferred embodiment and their heat input;

FIG. 7 a thermoelectric generator of a cylindrical shape based on the design principles proposed by the invention;

FIG. 8 part of a thermoelectric generator based on the design principles proposed by the invention in a flat format;

FIG. 9 an example of an alternatives embodiment of a thermocouple arrangement with an approximately wedge-shaped design of the two thermoelectric branches A, B;

FIG. 10 an example of another embodiment of a thermocouple arrangement comprising two approximately wedge-shaped thermoelectric branches A, B with a heat bridge;

FIG. 11 an example of an embodiment of a thermocouple arrangement using thin film technology;

FIG. 12 an example of an embodiment of a thermocouple arrangement with a pair of pyramid-shaped thermoelectric branches A, B.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described. Individual features or combinations of features from the different embodiments illustrated and described may be construed as independent inventive solutions or solutions proposed by the invention in their own right.

All the figures relating to ranges of values in the description should be construed as meaning that they include any and all part-ranges, in which case, for example, the range of 1 to 10 should be understood as including all part-ranges starting from the lower limit of 1 to the upper limit of 10, i.e. all part-ranges starting with a lower limit of 1 or more and ending with an upper limit of 10 or less, e.g. 1 to 1.7, or 3.2 to 8.1 or 5.5 to 10.

This invention is based on the physical phenomena and effects described briefly below.

In a closed thermoelectric circuit, Seebeck and Peltier effect are inextricably associated with one another. The two effects occur simultaneously and directly in the heated contact surface of a thermocouple and are merely part of one and the same physical energy conversion process.

In a thermocouple, the thermoelectric voltage occurs at full level even if the connection point (contact point) to be heated between the two thermoelectric branches is of only a small fraction of the conducting cross-sectional surface that would otherwise be available if making full use of the contact surface afforded by the conducting cross-sections of the thermoelectric branches.

In order to maintain the temperature gradient creating the voltage, it is enough to apply the requisite thermal energy to the drastically reduced contact surface only.

The quantity of heat which needs to be applied per unit of time likewise represents only a fraction, albeit not directly proportional, of the quantity of heat that would otherwise have to be applied if a contact surface were provided which corresponds to the total conducting cross-section or one of an even bigger surface area.

Heat can be introduced specifically into the drastically reduced, conducting connecting point between the two thermoelectric branches with appropriate thermal isolation from the ambient environment.

To achieve the above, the following options are open:

Restricting the application of heat directly to the minimized contact zone arranged in "dots" or "lines" by means of hot gases or fluids and optionally by means of likewise concentrated, thermally active radiation.

Making thermally conducting contact with the small contact zone in a "dot" or "linear" arrangement by means of an appropriately shaped, heat-conducting solid body.

Introducing heat directly into the small contact zone by means of a (preferably thin) thermally and electrically efficiently conducting film which connects the materials of the two thermoelectric branches on the cross-sectional surface corresponding to the dimensions of the drastically reduced contact zone and which is preferably, but not necessarily, longer, wider or thicker on the outside and can therefore direct heat absorbed from outside to the small contact surface(s).

Heat energy is converted into electrical energy exclusively in the molecular layers of the heated contact interface of the thermoelectric branches (and only there).

The reason for this is the extremely short "average free path length" of thermally excited electrons, which is in the nanometer range in the case of solid bodies.

The current intensity assumed due to the thermoelectric voltage generated obeys exclusively Ohm's law and is therefore limited only by the total resistance of the closed circuit.

The current intensity and current direction prevailing in the closed thermoelectric circuit due to the thermoelectric voltage generated draws off from the heated contact interface (and only there) by means of the mechanism of the Peltier effect mechanism exactly the quantity of heat corresponding to the energy equivalent of the electrical power generated.

The smaller the heated contact zone is in relation to the averaged conducting cross-section of the thermoelectric branches, the higher the proportional amount of thermal energy drawn from and hence removed from the contact surface by means of the Peltier effect mechanism per unit of time in order to obtain the energy equivalent for the electric power to be applied in the thermoelectric circuit.

This is caused due to the fact that the contact zone, drastically reduced in terms of its conducting cross-section, represents a considerable cross-sectional tapering for the current flowing through the closed circuit. Accordingly, a correspondingly high current density prevails within this cross-sectional tapering. The Peltier effect mechanism and hence the quantity of heat drawn off from the contact interface per unit of time is proportional to the current density prevailing in the contact surface.

Heat is drawn out of the contact interface directly and thus causes direct cooling of the contact surface. This heat loss must be permanently replaced in order to maintain the electric power prevailing in the closed circuit.

All heating of the material masses on either side extending across the directly adjacent molecular region of the heated contact surface is not directly proportion to the energy conversion but is to be regarded as a heat loss restricting the degree of efficiency.

The increase in ohmic internal resistance of every thermocouple due to the minimized contact cross-sectional surface to be heated causes a reduction in electrical power. However, due to the design of the thermocouples proposed by the invention, this power loss is significantly lower than expected and moves in only the order of 40%-50%. The heat losses of the drastically reduced, heated contact surface to the adjoining thermoelectric branches are much smaller by comparison. As a result, the proportionality shifts between lower power and the resultant (heat) losses, which ultimately results in an increase in the degree of efficiency.

From the explanations given above, it is clear that obtaining a high degree of thermoelectric efficiency requires a method which is specifically designed to distribute to the plurality of individual thermocouples making up the thermoelectric generator only the quantity of heat per unit of time corresponding to the energy equivalent of the electric power generated by the respective thermocouple in the ideal situation. In this respect, this required quantity of heat should be located at the highest possible usable temperature level. Theoretically, this will enable an extremely high degree of efficiency to be obtained. The solution to this proposed by the invention is achieved by a connecting contact with an extremely reduced conducting cross-section compared with the conducting cross-section of the thermoelectric branches, and the requisite temperature level is made available as far as possible only in this minimized conducting cross-section.

In practice, however, it has been necessary to opt for a compromise. This invention represents such a compromise and already achieves considerable progress in the direction towards high efficiency. This is achieved due to the fact that the connecting point to be heated between the two thermoelectric branches of every thermocouple has only one contact connection surface which accounts for at most 5% but preferably less than the "averaged total conducting cross-section" of the two thermoelectric branches of each thermocouple.

The "averaged total conducting cross-section" $\overline{\omega}$ of a thermocouple is the real or alternatively merely hypothetical value obtained if the volume of material of each of the two thermoelectric branches constituting a thermocouple with its respective length conducting the passing current flow is in a specific relationship. This is expressed by the equation:

$$\overline{\omega} = \frac{V_A}{l_A} + \frac{V_B}{l_B}$$

In the above:
$\overline{\omega}$=the averaged total conducting cross-section of the two thermoelectric branches
$V_A$=volume of thermoelectric branch A
$V_B$=volume of thermoelectric branch B
$l_A$=conducting length of thermoelectric branch A
$l_B$=conducting length of thermoelectric branch B The expression "averaged total conducting cross-section" is used in connection with this invention because, depending on the intended purpose of a specific design of thermocouple, the thermoelectric branches in question may be of different lengths and may have a varying cross-section.

The "averaged total conducting cross-section" is used to obtain a standard calculating principle for dimensioning the minimized contact cross-sectional surface on which the invention is based for different embodiments of thermocouples.

The laws, principles and operating modes explained above with respect to this invention represent the essential characteristics of the invention, namely the principle of the contact transition minimized in terms of its cross-sectional surface, the principle of applying a limited amount of thermal energy directly into this reduced contact region and the principle of the actual process of converting heat into electrical energy on a contact zone that is kept very small so that the thermal energy needed simultaneously and directly for the conversion can be drawn from there only due to the mechanism of the Peltier effect and then topped up again, also only there.

However, since the minimized contact transition which has to be kept permanently at the correct temperature suffers heat losses due to the thermal conductivity of the directly adjoining material masses of the thermoelectric branches which have to be topped up and therefore reduce the degree of efficiency, the degree of efficiency can be improved not just by the standard method used in the past, namely using materials which have a low thermal conductive capacity for the thermoelectric branches.

Another method which can be used is one whereby the conducting cross-sections of the two thermoelectric branch materials constituting a thermocouple may be varied relative to one another in a proportional ratio such that either the lowest ohmic resistance and hence highest possible electrical power prevails or the ratios are set to achieve the highest thermal resistance, thereby resulting in the lowest possible losses due to heat flow.

If opting for the solution of adapting to the lowest ohmic resistance, the conducting cross-section of the material with the poorer capacity to conduct electricity is made larger and that of the better conducting material is reduced in size.

It is primarily of practical advantage to use this additional method if there is a significant difference in the materials used for the two thermoelectric branches in terms of their ability to conduct electricity. Assuming that the two thermoelectric branches A, B are of the same length and initially have the same cross-section, the proportionality factor of the sought minimal resistance can be easily determined using the equation $$R_{opti} = \frac{(\sqrt{\sigma_A} + \sqrt{\sigma_B})^2}{2(\sigma_A + \sigma_B)}$$

In respect of the above:
$R_{opti}$=optimized (=lowest) series resistance of the two thermoelectric branches (A, B)
$\sigma_A$=electrical conductivity of material A
$\sigma_B$=electrical conductivity of material B If this formula is applied, for example, to the known combination of materials based on copper and constantan, which is merely used as an example to demonstrate the calculation in this specification, where the difference in their electrical conductivity is noticeably high, the result is:

$\sigma_A = 58 \cdot 10^6$ S/m  copper (A)

$\sigma_B = 2 \cdot 10^6$ S/m  constantan (B)

$\sigma_A+\sigma_B=60\cdot 10^6$ S/m $$_{opti}R_{CuKo} = \frac{(\sqrt{\sigma_A}+\sqrt{\sigma_B})^2}{2(\sigma_A+\sigma_B)}$$

$$= \frac{(\sqrt{58}+\sqrt{2})^2}{2.60}$$

$$= \frac{9,0296^2}{120}$$

$$= 0,6794 \rightarrow \text{proportionality number}$$

The resultant value of 0.6794 means that, by contrast with the (ohmic) resistance caused by the two thermoelectric branches of identical conducting cross-section in a series connection, this resistance can be reduced to the factor 0.6794, i.e. by virtually one third, if, instead of using identical conducting cross-sections, the cross-section of the poorer conducting material (in this example=constantan) is made larger whereas the conducting cross-section of the better conducting material (in this example=copper) is made smaller. The sum of the two conducting cross-sections in the value-free order 2 does not change, however, which means that the total dimensions of thermocouples modified in this manner do not change either.

Calculating the proportionality number for the optimal (lowest) resistance initially provides only a rapidly available aid for deciding whether it would be meaningful to optimize the cross-section or not. However, the proportionality number provides no information about what relationship is needed between the two thermoelectric branch cross-sections in order to obtain the optimal (lowest) resistance if the total dimensions of the thermocouple are kept the same. This ratio is calculated on the basis of the following equation:

$$f(x) = z = \frac{\frac{1}{\sigma_A}}{x} + \frac{\frac{1}{\sigma_B}}{2-x}$$

Solving the above function ultimately results in a quadratic equation. The higher of the two electrical conductance values is always used for $\sigma_A$. In the case outlined above, which is merely intended as an example, this would be the conductance of copper.

$$\rho_A = \frac{1}{\sigma_A}$$

$$x_{1,2} = -\frac{2\rho_A}{(\rho_B-\rho_A)} \pm \sqrt{\left[\frac{2\rho_A}{(\rho_B-\rho_A)}\right]^2 + \frac{4\rho_A}{(\rho_B-\rho_A)}}$$

$$\rho_B = \frac{1}{\sigma_B}$$

Of the two x values, only the positive value is relevant. In the example of a copper-constantan thermocouple given above as an illustration, and on condition that the branch lengths are the same, the above formula results in the following values:

$x = \varnothing A = 0.313 \rightarrow$ proportion for $\varnothing A$ (Cu)

$2-x = \varnothing B = 1.687 \rightarrow$ proportion for $\varnothing B$ (Con)

$\varnothing A + \varnothing B = 2.000$

The lowest resistance of two thermoelectric branches of copper and constantan in this example is obtained if the cross-section copper:cross-section constantan is based on a ratio of 0.313:1.687, in other words 1:5.39.

Reducing resistance in the illustrative example described here results in an increase in power to a factor of 1.472.

However varying the branch cross-sections simultaneously also results in a change in the heat flow passing through the thermocouple. The associated calculation demonstrates that the heat flow passing through is reduced to the factor 0.3767, or in other words to 3767% relative to the heat flow flowing through the thermocouple which does not have an optimized cross-section, this being regarded as 100%.

In this example, increasing power whilst simultaneously reducing heat flow means that the degree of efficiency of the copper-constantan thermocouple with an optimized cross-section is 3.9 times that of one with branches of the same dimensions. The calculation principles outlined in this specification apply to all thermocouple material combinations, provided the branch lengths are identical. If this is not the case, appropriate correction parameters must be applied to the characteristic values of the material of which the longer of the two branches is made.

Another possible way of limiting the high-loss heat flow from the heated to the cold end of the thermoelectric branches as far as possible is to dimension the conducting cross-sections of the thermoelectric branches so that they are conversely proportional to their heat conducting capacity. Provided the branches are of the same length, the dimension ratios (proportions) are obtained by the equation $\varnothing A : \varnothing B = \lambda A : \lambda B$ This alone, depending on the λ material characteristic values (thermal conductivity), also incidentally results in a significant increase in the degree of efficiency.

FIG. 1a illustrates a thermocouple based on the conventional design. The thermoelectric branches A and B made from semiconductor material are of the same size and are connected at the ends to be heated by a contact bridge 1 made from a good thermally and electrically conducting material extending across the entire surface of their respective total conducting cross-sectional surface 3, which also corresponds to the base surface.

This end of the thermocouple is subjected to the higher temperature Th. The end of the thermocouple facing the cooling temperature region $T_k$ incorporating the contact bridges 2, provides a series connection for each of the two thermoelectric branches A, B to an adjacent thermocouple, although this is not illustrated in the drawing. The thermoelectric branches are separated from one another by the gap 4. FIG. 1b illustrates a thermocouple of the same type but its thermoelectric branches A, B have had their cross-sections optimized to obtain the lowest resistance. The size ratios illustrated demonstrate that the optimal ratio would be obtained if material A had a 4-times better thermal and electrical conductivity than material B. The degree of efficiency on the basis of the illustrated proportions has an increase factor of 1.36 and is therefore 36% better than that which would be obtained based on the standard proportions illustrated in FIG. 1a. FIG. 1c illustrates a thermocouple of the same type, the thermoelectric branches A, B of which have been optimized to obtain the lowest thermal flow. In other words, the cross-section ratios are conversely proportional to the thermal conductivity λ of the materials. The degree of efficiency obtained on the basis of the branch proportions illustrated in FIG. 1c has an increase factor of 1.46 and is therefore 46% better than that which would be achieved on the basis of the standard proportions illustrated in FIG. 1a.

FIG. 2a illustrates a thermocouple provided with the minimized contact cross-sectional surfaces 3 proposed by the invention. The "averaged total conducting cross-section" in the case illustrated in FIG. 2a can be easily calculated because the thermoelectric branches A, B are of the same length and have the same (square) shape so that each of the two conducting cross-sections is identical to the base surfaces 5. The conducting connection in the temperature zone Th is provided in the form of a connecting bridge 1 of a significantly reduced size. The diagram illustrates a contact cross-section ratio of 3%. What this means is that the contact surfaces 3 which provide a conducting connection between the two thermoelectric branches A, B each occupy a surface area of 3% of the "averaged total conducting cross-sections", which in this instance is the sum of the two base surfaces 5. The electrical current 7, 7' flowing through the thermoelectric branches A thus undergoes a considerable narrowing in order to pass through the minimized contact surface at A and flow out again at the contact surface 3 disposed at B, and then flows onwards through the thermoelectric branches B with a cross-section which becomes wider again. FIG. 2b illustrates the view from underneath. The contact bridge 1 is connected to the two thermoelectric branches A, B by means of the contact surfaces 3 only. FIG. 2c illustrates how the heat input 9 is directed solely to the contact bridge 1. The (base) surfaces of A and B directed towards the temperature zone Th are screened by means of a good heat insulating material layer 6 to prevent any influence from Th with the exception of the contact bridge 1. Only the contact bridge 1, which is disposed in a sink 8 of the heat screen 6, is directly exposed to heat fed out of the region Th. The heat source may be of any of the types described above.

Due to the contact bridge 1, the appropriate quantity of heat is transmitted to the minimized contact surfaces 3 or, to be more exact, to the contact interfaces disposed there. The combined Seebeck/Peltier effect is active only in the small contact interfaces. FIG. 2d illustrates the bottom face of the contact bridge 1 exposed to the heat input, which is embedded in the sink 8 of the thermal insulation layer 6.

A relatively high current density flows through the contact interfaces comprising a surface of only 3% of the "averaged total conductive cross-section" in the example illustrated. It is only from these zones of a small surface area that the entire energy equivalent of heat corresponding to the electric power of the thermocouple is directly drawn. Based on a corresponding heat conductance value, material thickness and temperature gradient, the contact bridge 1 must keep the contact interfaces permanently topped up with the requisite amount of heat per unit of time. In addition to the energy-equivalent for the electrical power, the heat loss which the contact interfaces undergo due to the thermal contact with the material of the adjoining thermoelectric branches A, B must also be replenished.

FIG. 3a illustrates a thermocouple similar to those of the examples above where the basic principle of the invention is used so that the minimized contact cross-sectional surface is based on a "linear" orientation. By this is meant that the contact cross-sectional surfaces are provided in the form of two very slim strips, the length of which conforms to the material thickness of the thermoelectric branches. The calculations demonstrate that the internal resistance of the thermocouple can be kept lower than is the case if opting for a "dot" design, i.e. an orientation based on a small spot, as illustrated in FIG. 2.

In FIG. 3a, the contact cross-sectional surfaces 3 account for only 2% of the "averaged total conductive cross-section". The two thermoelectric branches A, B are connected to one another at their ends exposed to the temperature zone Th along only the two oppositely lying edges by a slim strip constituting the contact cross-section in each case. This corresponds to the "linear" modification mentioned above. The contact bridge 1 extends only slightly beyond the respective edge. The current 7, 7' flowing through the thermocouple is therefore narrowed across only two spatial axes instead of 3 axes, as is the case with the "dot" orientation. This results in a lower element resistance. In terms of design, function and application, the explanations already given in connection with FIGS. 2b, 2c, 2d apply to FIGS. 3b, 3c, 3d.

FIG. 4 illustrates a series connection of two thermocouples which correspond to those of FIG. 3a in terms of their design. The conducting contact cross-section 3 again corresponds to 2%. The example illustrated in FIG. 4 demonstrates that the heat input to the contact bridges 1 can also be configured in an indirect way. A solid body 10, preferably made from a good thermally conducting material, has a profiled structure on its surface, which extends into the sinks 8 in the heat insulation 6 and sits in a thermally conducting contact with the contact bridges 1. The solid body 10 may be the wall of a tube or shaft through which hot gases or hot fluids flow, for example. The heat absorbed by it is transmitted directly to the contact bridges 1.

FIG. 5 illustrates a preferred application of the operating principle proposed by the invention. The two thermoelectric branches A, B are disposed so close to one another that only a very slim, isolating dividing gap 4 is created.

The dividing gap 4 may also be replaced by a dividing layer of electrically isolating material. In this case, the isolating dividing layer does not extend quite as far as the surfaces 5 of the thermoelectric branches A, B.

Extending into the gaps 4 by a small amount from across the length of the two edges is what will be referred to in this specification as a "thermo-tongue" 11 in the form of a thin plate of good thermally and electrically conducting material, preferably copper. This part of the "thermo-tongue" 11 is connected to the thermoelectric branches A, B to provide good conduction and therefore replaces the contact bridges 1 described above. At the same time, this also constitutes the minimized contact cross-sectional surface 3. In the example illustrated in FIG. 5, this contact cross-sectional surface represents 4% of the "averaged total conductive cross-section". At its end facing the temperature level Th, the "thermo-tongue" 11 may optionally be considerably wider, thicker or additionally also profiled. The part of the thermo-tongue 11 that will be referred to as the "thermo-foot" 12 in the description below is provided as a means of absorbing a sufficient quantity of thermal energy emitted by a heat source of whatever type and directing it onwards via the "thermo-tongue" 11 to the minimized contact cross-sectional surfaces 3. The dimensions of the thermo-tongue 11 and thermo-foot 12 outside of the contact bridge 1 formed by the thermo-tongue 11 itself will depend on the material characteristic values, temperature level and heat requirement of the contact-cross-sectional surfaces 3.

FIG. 6a illustrates an improved, preferred embodiment of the basic principle proposed by the invention. The thermoelectric branches A, B have a rounded shape pointing in the direction of the minimized contact cross-sectional surface and hence a conducting cross-section which varies across the conducting length of the thermoelectric branches. In other words, a cross-section of the thermoelectric branches A, B has an at least approximately arcuate and convex contour relative to a plane intersecting the contact bridges 1, 2. The rounded shape largely follows the effective and narrowing current path 7, 7' to the "linearly" configured contact cross-sectional surfaces 3. By contrast with the version illustrated in FIG. 5, this version also brings a saving on thermocouple material. In the version illustrated in FIG. 5, not all of the material of each thermoelectric branch is involved in directing the current onwards due to the current pinching effect. The rounded shape of the thermoelectric branches A, B, illustrated in FIGS. 6a, 6b, 6c, makes allowance for this. The reduction in the branch cross-sections continuously following the current pinching in the direction of the contact cross-sectional surfaces 3 also reduces the heat fed away from the contact cross-sectional surfaces 3. Broken lines 13 indicate and delimit for each of the two thermoelectric branches a hypothetical, square-shaped body representing the volume-equivalent for the associated thermoelectric branches for the same conductor length. In FIG. 6, the rounded thermoelectric branches A, B are of the same size and length, as a result of which the two hypothetical, square-shaped volume-equivalents are also of the same size. The base surfaces 5' of the hypothetical bodies correspond to the "averaged conducting cross-section" of each of the two branches A, B and are obtained from the equation for $\bar{\omega}$ defined earlier on in the description. The sum of the two surfaces 5' gives the "averaged total conducting cross-section" of the thermocouple, from which the size and % value for the contact cross-sectional surface 3 can be determined. In the examples illustrated in FIGS. 6a, 6b, 6c, the minimized contact cross-sectional surface represents 2% of the "averaged total conducting cross-section". The thermo-tongue 11 becomes larger in the region of Th to form a "thermo-foot" 12.

FIG. 6b illustrates how this variant is employed in practice. The thermo-tongue 11 and a part of the thermo-foot 12 is surrounded by a heat-isolating layer 6. The thermo-foot 12 extends through the opening of a wall 14. The wall 14 may be the wall of a tube or a shaft through which a gaseous or fluid heat carrier circulates. The thermal energy 9 absorbed by the thermo-foot 12 is transmitted via the thermo-tongue 11 to the contact points or contact cross-sectional surface 3.

FIG. 6c illustrates a detail from a series connection of such thermocouples proposed by the invention. The thermo-tongue 11 is of a shorter design and is provided with a wide, flat thermo-foot 12. The latter sits in a flat, good thermally conducting contact with a wall 14 which is at the temperature level Th, which is achieved by any of the ways described above (for example by hot gases, hot fluids or adsorption of thermally active radiation). The thermal energy absorbed by the thermo-foot 12 is transmitted via the thermo-tongue 11 to the contact cross-sectional surface 3.

FIG. 7 illustrates a thermoelectric generator operating by the basic concepts proposed by the invention and based on a radial construction.

A number of thermocouples 21 are disposed in an annular arrangement around the wall of a central tube 16. The thermocouples correspond to the design illustrated in FIG. 6 with rounded thermoelectric branches A, B. The contact bridges 2 in the temperature region $T_k$ connect each thermocouple to the adjacent thermocouples in a series connection. The contact bridges 2 thus form a concentrically disposed ring around the central tube 16, interrupted by the dividing gaps 4 at regular intervals. At any position 22, one of the contact bridges 2 is split so that the voltage U of the series connection can be drawn from there. The rounded thermoelectric branches A, B of each thermocouple are electrically connected at the edges directed towards the central tube 16 via a thermo-tongue 11, where the minimized contact cross-sectional surface is also disposed. The thermo-tongues 11 are each provide with a thermo-foot 12 which sits in a thermally conducting contact with the external surface of the central tube 16. If the central tube 16 is made from an electrically conducting material (for example metal), every thermo-foot 12 is protected from any direct contact with the tube 16 by means of a thin, electrically isolating intermediate layer 15. The cavities between the tube 16, thermo-feet 12, thermo-tongues 11 and thermocouples 21 are filled with a good heat insulating and electrically isolating material 6. The interrupted ring of contact bridges 2 is surrounded by a thin, electrically isolating jacket 17. The jacket 17 is preferably, although not necessarily, surrounded by an annular cooling body 18 with cooling fins. Accordingly, the annular series connection of thermocouples together with all the associated parts is enclosed between the central tube 16 and the concentrically disposed annular cooling body 18 in a fixed mechanically bonded arrangement. The temperature level Th prevails in the central tube 16, induced either by hot gases, hot fluids or any other heat generating or heat carrying substance 20. By heating the wall of the tube 16 in this manner, heat is transmitted to the thermo-feet 12 and passes on via the thermo-tongues 11 to the minimized contact cross-sectional surfaces 3. This causes the Seebeck effect generating the voltage U.

Provided the electrical circuit is closed, the accompanying Peltier effect also occurs simultaneously and directly, which directly draws off the energy-equivalent of heat corresponding to the electric power of the circuit from the boundary layers of the minimized contact cross-sectional surfaces via the high current density prevailing there.

A thermoelectric generator may be made up of a plurality of thermocouple rings, the principle of which is illustrated in FIG. 7, either in a series connection, a parallel connection or any combination of the two.

FIG. 8 illustrates a section of another embodiment designed on the same basic principles. The embodiment illustrated as an example is based on a flat design. The thermo-feet 12 in this instance are elongate in structure and extend in an electrically isolated arrangement through the wall of a flat tube or shaft 19 into its cavity. The temperature level Th prevails in the cavity of the tube or shaft 19 using any of the methods 23 described above. The thermo-feet 12 absorb heat from the temperature level Th, which is transmitted by means of the thermo-tongues 11 to the minimized contact cross-sectional surfaces 3. The tube or shaft 19 may also have a square or rectangular cross-section and the thermocouples are mounted with the thermo-tongues 11 and thermo-feet 12 on all flat external faces of the tube or shaft 19. All of the elongate thermo-feet 12 extend in an isolated arrangement through bores into the cavity of the tube or shaft 19, where the temperature level Th is supplied.

Based on these examples, this invention offers a way of directly converting thermal energy into electricity which enables very significant progress to be made in this technical field. The reason for this is that, on the one hand, the thermoelectric voltage conforming to the Seebeck coefficient and the temperature gradient is generated at full power if the "hot" connection point of the thermocouple materials is designed as only a very small contact point and the requisite temperature prevails at only this small contact point. On the other hand, in addition to the Seebeck effect, the Peltier effect also unfailingly occurs in the closed circuit simultaneously and directly, which draws the thermal energy-equivalent for the electrical power from this "hot" contact point and only from there. If the requisite input of thermal energy is restricted to only the very small contact point, then it follows that as a result of this limited input, only this thermal energy is converted. The heat losses which nevertheless occur in the material of the adjoining thermoelectric branches, which is large compared with the contact point, are lower than would be the case if there were a full-surface contact. The power loss caused by increased resistance of the thermocouples is compensated several times over by the substantially reduced losses of heat flow. This results in the basic improvement in the degree of efficiency.

FIG. 9 illustrates an example of an alternative embodiment of a thermocouple arrangement with an approximately wedge-shaped design of the two thermoelectric branches A, B.

The two thermoelectric branches A, B each have a trapezoid-shaped cross-section and are disposed adjacent to one another so that a narrow gap 4 is left free between them. From the first electrical contact bridge 1 through to the oppositely lying contact bridges 2, the width of the two thermoelectric branches A, B becomes linearly bigger. In the external volume region adjacent to the two thermoelectric branches A, B, an isolating element is provided by the heat insulating material 6. Accordingly, there is a first passage surface $F_1$ adjoining the first electrical contact bridge 1 and on the other side a second passage surface F adjoining the electrical contact bridges 2 for a heat flow Q flowing through the thermocouple. In the region of the first contact bridge 1, the first passage surface $F_1$ is therefore bounded by the isolating elements made from the heat insulating material 6. The extension of the two thermoelectric branches A, B between the two electrical contact bridges 1, 2 is based on a length l—in the diagram shown in FIG. 9. The first passage surface $F_1$ and the second passage surface $F_1$ each of which forms an end of the thermoelectric branches A, B, are simultaneously also those surfaces which are available in the region of said ends for conducting the electrical current 7, 7'. Naturally, allowance must be made for the fact that in the two thermoelectric branches A, B, the electrical current 7, 7' flows in different directions (FIG. 2a) whereas the flow direction of the heat flow is the same. Accordingly, approximately half of the first passage surface $F_1$ and the second passage surface F is decisive in determining the density of the flow of electric current in each case.

To make an approximate calculation of the degree of efficiency of the thermocouple comprising the two thermoelectric branches A, B, it is assumed that the scalar field of the location-dependent temperature $T(\vec{r})$ depends on only the longitudinal extension corresponding to the length 1. In accordance with the co-ordinate cross shown in FIG. 9, therefore, the temperature T depends only on the co-ordinate x, i.e. T(x). The known equation for heat flow density $\vec{q}$, which equals the product of the negative value of the heat conductivity λ and the gradient of the temperature distribution T(x), then becomes an equation which is dependent on only the co-ordinate x.

$$\vec{q} = -\lambda \cdot \nabla T$$

$$\frac{Q}{F(x)} = -\lambda \cdot \frac{dT(x)}{dx}$$

It is also assumed that only the volume of the two thermoelectric branches A, B is available for the entire heat flow Q. This is tantamount to the peripheral conditions for the heat conductance equation given above whereby the total heat flow Q through the first passage surface $F_1$ must be equal to the heat flow Q through the second passage surface F. Based on these assumptions, therefore, the result is a total heat flow Q which is proportional to the temperature difference $T_h - T_k$ prevailing at the thermocouple in accordance with the equation below.

$$Q = \frac{2 \cdot \lambda \cdot F}{l} \cdot \frac{1}{1 + \frac{F}{F_1}} \cdot (T_h - T_k)$$

It was also assumed that the two thermoelectric branches A, B have the same heat conductivity λ.

In order to calculate the electric power P which can be drawn off from the thermocouple, it is also assumed, taking a simplified approach, that the specific electrical resistance ρ of the two thermoelectric branches A, B is identical. The electrical power is calculated from the quotient of the square of the Seebeck voltage and the electrical resistance of the thermoelectric branches A, B electrically connected in series in accordance with the following equation.

$$P = \frac{S^2 \cdot (T_h - T_k)^2}{R}$$

Assuming that the electrical current density $\vec{j}$ in the thermoelectric branches A, B is dependent on only the co-ordinate x, the total electrical resistance R of the thermoelectric branches A, B connected in series is calculated by the following equation.

$$R = \frac{4 \cdot \rho \cdot l}{F} \cdot \frac{\ln\left|\frac{F}{F_1}\right|}{1 - \frac{F_1}{F}}$$

The degree of efficiency η calculated on the basis of the quotient of the electric power P and total heat flow Q is therefore calculated using the following equation.

$$\eta = \frac{P}{Q} = \frac{S^2}{4 \cdot \rho \cdot \lambda} \cdot (T_h - T_k) \cdot \frac{1}{2} \cdot \frac{\frac{F}{F_1} - \frac{F_1}{F}}{\ln\left|\frac{F}{F_1}\right|}$$

Accordingly, there is surprisingly an increase in the degree of efficiency η, the smaller the first passage surface $F_1$ is as a ratio of the second passage surface F. This appears to be surprising because in accordance with the equation for heat flow Q given above, selecting a smaller value for the passage surface $F_1$ also results in a correspondingly smaller value for the total heat flow Q. If, on the other hand, the heat flow Q is fixed, as is the case with a heat source with a heating power that is constant over time, this means that a higher temperature difference $T_h - T_k$ must be set, which—in accordance with the equation for the degree of efficiency η given above—also results in an increase in the degree of efficiency η.

Consequently, by opting for a design of thermocouple where the first passage surface $F_1$ is in a ratio that is substantially smaller than the second passage surface $F_1$ the resultant electrical power P is increased significantly as a ratio of the heat flow Q passing through the thermoelectric branches A, B. By opting for this design feature and selecting a small first passage surface $F_1$, both the thermal current density $\vec{q}$ and the electrical current density $\vec{j}$ in the region of this passage surface $F_1$ are significantly increased.

With respect to the examples of embodiments illustrated in FIGS. 2 to 9, it was always assumed that the electrical contact bridges 2 are directed towards the cool or lower temperature region $T_k$ and the electrical contact bridge 1 is facing the higher temperature level $T_h$. Alternatively, however, it would also be possible to opt for an arrangement in which the first contact bridge 1 or the first passage surface F1 is the one facing the lower temperature level $T_k$. The increase in the degree of efficiency η described above can also be achieved using such a converse disposition or arrangement of the thermoelectric branches A, B.

FIG. 10 illustrates an example of an alternative embodiment of a thermocouple arrangement comprising two approximately wedge-shaped thermoelectric branches A, B. Based on this embodiment, the first passage surface $F_1$ is connected to a heat bridge 11. The heat bridge 11 is preferably plate-shaped (like the "thermo-tongue" illustrated in FIG. 5), and is placed in thermal contact with the first passage surface $F_1$ by a narrow end face and is oriented essentially parallel with the gap 4 between the two thermoelectric branches A, B. On either side of the thermoelectric branches A, B and the heat bridge 11, isolating elements are provided in the form of heat insulating materials 6 so that only the heat bridge 11 and—adjoining it—the two thermoelectric branches A, B are available for the entire heat flow Q to pass through the region of temperature $T_h$ to the region of temperature $T_k$. Unlike the embodiment illustrated as an example in FIG. 9, the first passage surface $F_1$ is selected so that it is smaller and the total heat loss Q is also concentrated on the region of the passage surface $F_1$ due to the heat bridge 11 extending across a length $l_1$.

The assumptions made for calculating the degree of efficiency η of the embodiment illustrated as an example in FIG. 9 can also be applied when calculating the degree of efficiency η for this embodiment but allowance must be made for the fact that as a function of the drop in temperature along the heat bridge 11, the temperature difference $T_C - T_k$ which determines the generation of thermoelectric voltage is smaller than the total available temperature difference $T_h - T_k$. $T_C$ in the latter stands for the temperature at the first passage surface $F_1$. The heat bridge 11 has a heat conducting capacity $\lambda_1$. The temperature difference $T_C - T_k$ prevailing at the thermocouple of the two thermoelectric branches A, B is therefore calculated on the basis of the equation below.

$$T_C - T_k = (T_h - T_k) \cdot \frac{1}{1 + \frac{2 \cdot \varepsilon}{1 + \frac{F}{F_1}}} \quad \text{where } \varepsilon = \frac{\lambda \cdot l_1 \cdot F}{\lambda_1 \cdot l \cdot F_1}$$

Accordingly, a value calculated on the basis of the equation below applies to the degree of efficiency η of the thermoelectric generator or thermocouple arrangement illustrated in FIG. 10.

$$\eta = \frac{S^2}{4 \cdot \rho \cdot \lambda} \cdot (T_h - T_k) \cdot \frac{1}{2} \cdot \frac{\frac{F}{F_1} - \frac{F_1}{F}}{\ln\left|\frac{F}{F_1}\right|} \cdot \frac{1}{1 + \frac{2 \cdot \varepsilon}{1 + \frac{F}{F_1}}}$$

By selecting a first passage surface $F_1$ that is correspondingly small as a ratio of the second passage surface 11, therefore, a significantly higher degree of efficiency η can be achieved.

A comparison of the degree of efficiency η with the degree of efficiency of a thermocouple with a constant cross-section F across the length l shows that already with effect from a value of >10 for the ratio of the second passage surface F to the first passage surface $F_1$, the degree of efficiency can be more than doubled. That is to say, the value of the first passage surface $F_1$ for the heat flow Q is less than 10% of the value of the second passage surface F. An even more significant improvement in the degree of efficiency η can be achieved if, for a value of the passage surface $F_1$, it is selected from a range that is equal to or less than 5% to 2% of the second passage surface F. It is preferable if the value for the passage surface $F_1$ is selected from a range which is equal to or less than 2%, in particular equal to or less than 1%, of the second passage surface F. In this respect, however, allowance must be made for the fact that under real conditions, parts of the heat flow Q are lost due heat being conducted via the isolating elements of the heat insulating material 6 which are not totally unavoidable, which means that the theoretic possible higher degree of efficiency cannot be quite achieved. However, it was found that by selecting a ratio from the specific heat conductivity of the heat bridge 11 to the specific heat conductivity of the isolating element or heat insulating materials 6 with a value that is equal to or less than $10^5$, considerable increases can be achieved in the degree of efficiency η.

With regard to the materials used for the two thermoelectric branches A, B, these are selected from a group comprising metals, semiconductors and minerals. Particularly suitable minerals are natural or synthetic scutterudite for example. The material used for the heat bridge 11 is preferably both a good thermal conductor and a good electrically conducting metal. As an alternative to using a layer of heat insulating material 6, it would also be possible for the area around the thermoelectric branches A, B and heat bridge 11 to be evacuated, thereby largely preventing any loss of heat flow.

FIG. 11 illustrates an example of another alternative embodiment of a thermoelectric generator or thermocouple arrangement, based on thin film technology. Thermoelectric branches A, B are alternated with one another and are connected in series via electrical contact bridges 1, 2. Due to the trapezoid shape of the individual thermoelectric branches A, B, the degree of efficiency can also be increased with this example in the same way as described in connection with the embodiment illustrated as an example in FIG. 9. Based on the sequence of thermoelectric branches A, B, A, B, . . . electrically connected in series in this thermocouple arrangement, a corresponding multiple of the Seebeck-voltage of an individual pair of thermoelectric branches A, B is available. In order to provide a clearer overall view in FIG. 11, the isolating elements have been omitted and the thickness of the films of the thermoelectric branches A, B is also illustrated on a larger scale.

FIG. 12 illustrates an example of another embodiment of a thermocouple arrangement with a pair of pyramid-shaped thermoelectric branches A, B. The two thermoelectric branches A, B in this instance are based on the shape of an oblique truncated pyramid. Separated from one another by a thin gap 4, the pair of thermoelectric branches A, B thus forms an equal-sided truncated pyramid with the first passage surface $F_1$ and the second passage surface F for the den heat flow Q constituting the top and base surface of the truncated pyramid.

As an alternative to the flat or cylindrical side faces (FIG. 6 to FIG. 8) of the thermoelectric branches A, B, it would also be possible to use other different shapes. For example, a cross-section of the thermoelectric branches A, B might also be one which has a parabolic or elliptical and convex contour relative to a plane intersecting the first passage surface $F_1$ and the second passage surface F. Alternatively, the contour of the thermoelectric branch pair A, B might also be concavely instead of convexly curved.

The embodiments illustrated as examples represent possible variants of the thermoelectric generator and thermocouple arrangement, and it should be pointed out at this stage that the invention is not specifically limited to the variants specifically illustrated, and instead the individual variants may be used in different combinations with one another and these possible variations lie within the reach of the person skilled in this technical field given the disclosed technical teaching. Accordingly, all conceivable variants which can be obtained by combining individual details of the variants described and illustrated are possible and fall within the scope of the invention.

For the sake of good order, finally, it should be pointed out that, in order to provide a clearer understanding of the structure of the thermoelectric generator and thermocouple arrangement, they and their constituent parts are illustrated to a certain extent out of scale and/or on an enlarged scale and/or on a reduced scale.

The objective underlying the independent inventive solutions may be found in the description.

Above all, the individual embodiments of the subject matter illustrated in the drawings constitute independent solutions proposed by the invention in their own right. The objectives and associated solutions proposed by the invention may be found in the detailed descriptions of these drawings.

LIST OF REFERENCE NUMBERS

1 Contact bridge
2 Contact bridge
3 Cross-sectional surface
4 Gap
5 Base surface
5' Base surface of the volume-equivalent square
6 Layer of heat insulating material
7 Electrical current
7' Electrical current
8 Sink
9 Heat input
10 Solid body
11 Heat bridge/"thermo-tongue"
12 Thermo-foot
13 Volume-equivalent square
14 Wall
15 Intermediate layer
16 Tube
17 Electrically isolating jacket
18 Cooling body
19 Shaft
20 Heat carrying substance
21 Thermocouple
22 Position
23 Heat carrying substance
24
25
A Thermoelectric branches
B Thermoelectric branches
$F_1$ First passage surface
F Second passage surface
l Length of the thermoelectric branches
$l_1$ Length of the heat bridge

The invention claimed is:

1. Method of converting heat into electrical energy by means of the thermoelectric effect, whereby at least two thermocouples each made from at least two different materials inducing the Seebeck effect serving as thermoelectric branches are connected to one another in a series or a parallel connection or a combination of the two connections, and the thermocouples each have a contact point to be heated, wherein the following method steps are applied:
   a) the contact point to be heated has a contact surface relative to the thermoelectric branches that is less than 5% of the "averaged total conductive cross-section" determined by the following equation $$\varpi = \frac{V_A}{l_A} + \frac{V_B}{l_B}$$

in which:
   $\varpi$=averaged total conducting cross-section of the two thermoelectric branches
   $V_A$=volume of thermoelectric branch A
   $V_B$=volume of thermoelectric branch B
   $l_A$=conducting length of thermoelectric branch A
   $l_B$=conducting length of thermoelectric branch B
   b) thermal energy input from outside is fed directly to only the contact points or the contact surfaces formed by the contact points;
   c) the thermal energy fed in from outside is directed to the contact points or contact surfaces formed by the contact points in only a limited quantity corresponding to the energy equivalent of electric power generated by the respective thermocouple plus the losses occurring due to heat dispersion to the adjoining thermoelectric branches.

2. The method according to claim 1, wherein an isolating element is provided, by means of which a first passage surface ($F_1$) of each of the at least two thermocouples for the heat flow (Q) and for the electrical current (7, 7') is laterally bounded, i.e. at the periphery of the first passage surface ($F_1$).

3. The method according to claim 2, wherein the isolating element is provided in the form of a layer of heat insulating material (6).

4. The method according to claim 1, wherein the first passage surface ($F_1$) is provided in the form of a surface of a first contact bridge (1) electrically connecting the two thermoelectric branches (A, B).

5. The method according to claim 1, wherein at least one material of the thermoelectric branches (A, B) is selected from a group comprising metals, semiconductors and minerals.

6. The method according to claim 5, wherein at least one material of the thermoelectric branches (A, B) is selected from a group comprising natural or synthetic scutterudite.

7. The method according to claim 1, wherein the thermoelectric branches (A, B) are made using thin-film technology.

8. The method according to claim 1, wherein the dimensions of the thermoelectric branches (A, B) are configured in accordance with the principle of cross-section optimization for the lowest electrical series resistance.

9. The method according to claim 1, wherein the dimensions of the thermoelectric branches (A, B) are configured in accordance with the principle of cross-section optimization for the highest thermal parallel resistance.

* * * * *

UNITED STATES PATENT AND TRADEMARK OFFICE
CERTIFICATE OF CORRECTION

PATENT NO.       : 8,519,253 B2                                    Page 1 of 1
APPLICATION NO. : 12/998654
DATED            : August 27, 2013
INVENTOR(S)      : Fuchs et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 119 days.

Signed and Sealed this
Fifteenth Day of September, 2015

Michelle K. Lee
*Director of the United States Patent and Trademark Office*